United States Patent
Hönigschmid et al.

(10) Patent No.: US 6,430,080 B1
(45) Date of Patent: Aug. 6, 2002

(54) INTEGRATED FERROELECTRIC MEMORY HAVING PLATE LINES SELECTED BY A COLUMN DECODER

(75) Inventors: Heinz Hönigschmid, Essex Junction, VT (US); Tobias Schlager, Kumberg (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/968,577

(22) Filed: Oct. 1, 2001

Related U.S. Application Data

(63) Continuation of application No. PCT/DE00/00997, filed on Apr. 3, 2000.

(30) Foreign Application Priority Data

Apr. 1, 1999 (DE) .......................................... 199 15 081

(51) Int. Cl.$^7$ ............................................. G11C 11/22
(52) U.S. Cl. ...................... 365/145; 365/207; 365/190; 365/196; 365/230.06; 365/189.08
(58) Field of Search .................................. 365/145, 149, 365/206, 207, 210, 190, 196, 230.06, 189.08

(56) References Cited

U.S. PATENT DOCUMENTS

| | | | | |
|---|---|---|---|---|
| 5,592,410 A | * | 1/1997 | Verhaeghe et al. | 365/145 |
| 5,963,466 A | * | 10/1999 | Evans, Jr. | 365/145 |
| 5,991,188 A | * | 11/1999 | Chung et al. | 365/145 |
| 6,147,895 A | * | 11/2000 | Kamp | 365/145 |
| 6,191,971 B1 | * | 2/2001 | Tanaka et al. | 365/145 |
| 6,301,145 B1 | * | 10/2001 | Nishihara | 365/145 |

FOREIGN PATENT DOCUMENTS

DE      41 18 847 A1     12/1991      G11C/7/00

* cited by examiner

*Primary Examiner*—Andrew Q. Tran
(74) *Attorney, Agent, or Firm*—Laurence A. Greenberg; Werner H. Stemer; Gregory L. Mayback

(57) ABSTRACT

An integrated memory in which the plate lines run parallel to the bit lines and are driven by the column decoder. The effect achieved by the fact that each plate line is connected to the memory cells of the associated bit line is that only those memory cells whose associated bit line is required for the respective memory access are affected by the pulsed signals of the plate line. Therefore, only the potential of that bit line which is currently required for a data transfer is influenced by pulsed signals on the associated plate lines.

7 Claims, 1 Drawing Sheet

INTEGRATED FERROELECTRIC MEMORY HAVING PLATE LINES SELECTED BY A COLUMN DECODER

CROSS-REFERENCE TO RELATED APPLICATION

This application is a continuation of copending International Application No. PCT/DE00/00997, filed Apr. 3, 2000, which designated the United States.

BACKGROUND OF THE INVENTION

Field of the Invention

The invention relates to an integrated memory whose memory cells are connected to plate lines.

U.S. Pat. No. 5,592,410 describes a ferroelectric memory in the form of an FRAM or FeRAM (Ferroelectric Random Access Memory). Its memory cells have selection transistors and storage capacitors. The storage capacitors have a ferroelectric dielectric which can assume different polarization states depending on a stored logic state. The polarization state influences the capacitance of the storage capacitor. One electrode of each storage capacitor is connected to a bit line of the memory via the corresponding selection transistor. A control terminal of the selection transistor is connected to a word line of the memory. A second electrode of the storage capacitor is connected to a plate line. During a read access, the selection transistor is turned on and the potential of the plate line is pulsed from a low potential to a high potential. The change in the potential on the bit line connected to the memory cell is subsequently evaluated. It is a measure of the polarization-dependent capacitance of the storage capacitor and therefore serves for ascertaining the respective logic state that is stored.

In U.S. Pat. No. 5,592,410, the word lines run perpendicularly to the bit lines and the plate lines run parallel to the word lines. Each plate line is connected to the same output of a word decoder, to which the associated word line is also connected. Thus, through activation of one of the word lines, the associated plate line is always simultaneously activated as well. The result of this is that all of the memory cells which are selected via the respectively activated word line influence the potential on the associated bit line through the pulsed signal on the plate line connected to them.

SUMMARY OF THE INVENTION

It is accordingly an object of the invention to provide an integrated memory which overcomes the above-mentioned disadvantageous of the prior art apparatus of this general type. In particular, it is an object of the invention to provide an integrated memory having memory cells with storage capacitors that are connected to plate lines, and in which, upon activation of a word line, only the potential on a portion of the bit lines which are crossed by the word line is influenced by pulsed signals on the plate lines.

With the foregoing and other objects in view there is provided, in accordance with the invention, an integrated memory, that includes: bit lines; word lines; crossover points where the bit lines crossover the word lines; and memory cells that are configured at the crossover points. Each one of the memory cells includes at least one selection transistor having a control terminal that is connected to one of the word lines. Each one of the memory cells includes a storage capacitor having a first electrode that is remote from the selection transistor and having a second electrode. The selection transistor connects the second electrode of the storage capacitor to one of the bit lines. The memory also includes plate lines for carrying pulsed signals. Each one of the plate lines is connected to the first electrode of the storage capacitor of a respective one of the memory cells. The plate lines are configured parallel to the bit lines. The memory also includes a row decoder for addressing the word lines, and a column decoder for selecting at least one of the plate lines in dependence on a column address. The memory also includes sense amplifiers for amplifying data that are read from the memory cells. Each one of the sense amplifiers are respectively connected to at least two of the bit lines, which are assigned different column addresses. The memory also includes control units for performing a function that is selected from the group consisting of supplying input signals to the sense amplifiers, forwarding output signals from the sense amplifiers, and activating the sense amplifiers, the control units including first switching elements and second switching elements. The memory also includes data lines for transferring the data that have been read from the memory cells and that have been amplified by the sense amplifiers. The second switching elements connect the data lines to the sense amplifiers. A respective one of the plate lines and at least one of the bit lines are connected to the same one of the memory cells. The sense amplifiers are connected to a respective one of the bit lines by a respective one of the first switching elements. Each one of the first switching elements includes a control terminal that is connected to the column decoder. Each one of the second switching elements includes a control terminal. The plate lines define groups of the plate lines. Each one of the groups of the plate lines is respectively assigned to the at least two of the bit lines that are connected to a respective one of the sense amplifiers. Each one of the groups of the plate lines is connected, using an OR function, to the control terminal of one of the second switching elements which is connected to a respective one of the sense amplifiers.

In accordance with an added feature of the invention, the plate lines which are connected to the storage capacitors of the memory cells are arranged parallel to the bit lines. A respective one of the plate lines and at least one of the bit lines are connected to the same memory cell. A column decoder serves for selecting one of the plate lines in a manner that is dependent on a column address that is present.

Thus, whereas in U.S. Pat. No. 5,592,410 the plate lines run parallel to the word lines and are connected to outputs of the word line decoder, in the invention disclosed herein, the plate lines run parallel to the bit lines and are driven by the column decoder. The effect achieved by the fact that each plate line is connected to the memory cells of the associated bit line is that only those memory cells whose associated bit line is required for the respective memory access are affected by the pulsed signals of the plate line. Therefore, only the potential of that bit line which is currently required for a data transfer is influenced by pulsed signals on the associated plate lines.

In accordance with an additional feature of the invention, the integrated memory has control units for influencing a data transfer from the bit lines to a point outside the memory, which each have a control input which is connected to a respective output of the column decoder via one of the plate lines.

In this development, then, the plate lines serve for communicating control signals from the column decoder to the control units.

In accordance with another feature of the invention, the control units are, for example, first switching elements via which the bit lines are connected to sense amplifiers.

In accordance with a further feature of the invention, the control units are activation units which are each assigned to one of the sense amplifiers and serve for activating the respective sense amplifier.

In accordance with a further added feature of the invention, the control units are second switching elements, via which, the sense amplifiers are connected to data lines which serve for transferring data that have been read from the memory cells and have been amplified by the sense amplifiers.

In accordance with a concomitant feature of the invention, the storage capacitor of each one of the memory cells includes a ferroelectric dielectric.

Other features which are considered as characteristic for the invention are set forth in the appended claims.

Although the invention is illustrated and described herein as embodied in integrated ferroelectric memory whose plate lines are selected by the column decoder, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
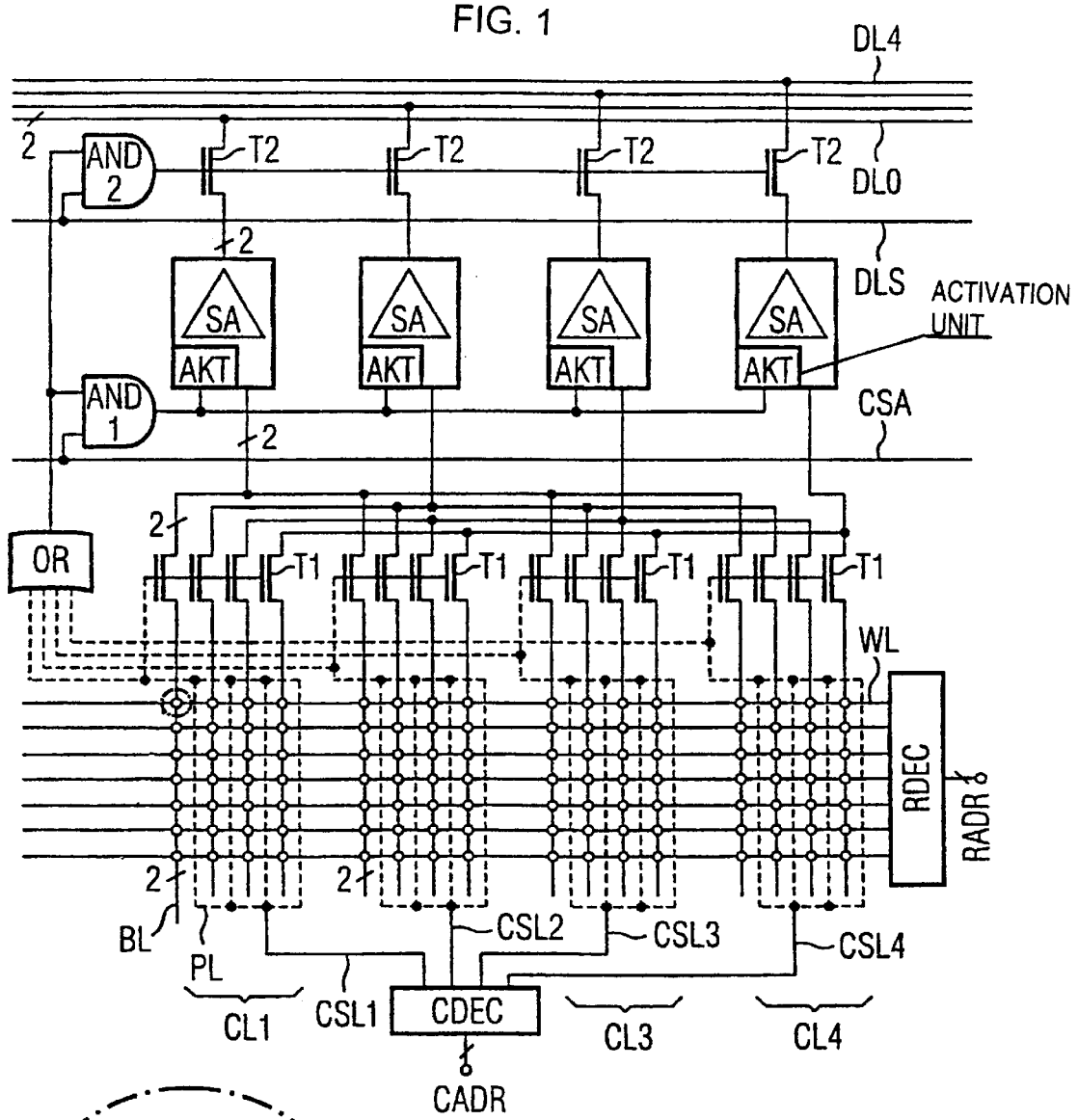
FIG. 1 shows an FRAM having memory cells MC of the one-transistor/one-capacitor type.

Referring now to the figures of the drawing in detail and first, particularly, to FIG. 1 thereof, there is shown an FRAM having memory cells MC of the one-transistor/one-capacitor type. The memory cells MC are arranged at crossover points between bit lines BL and word lines WL. The bit lines BL and the word lines WL run perpendicularly to one another. The memory has a multiplicity of plate lines PL, which are arranged parallel to the bit lines BL. The bit lines BL are combined to form bit line pairs. To simplify the drawing, in each case only one bit line BL of each bit line pair has been illustrated in the figure. In reality, when one of the bit lines BL is selected, a complementary bit line is always simultaneously selected as well, and supplies a corresponding reference signal in the case of a read access to one of the memory cells MC.

Figure 2:
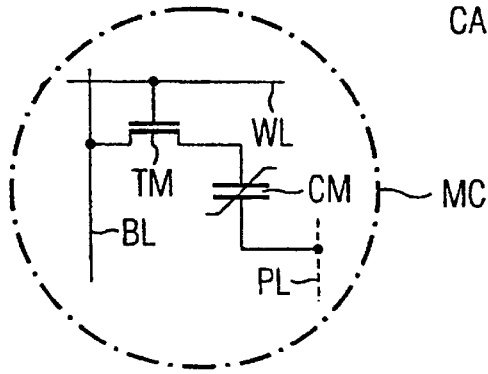
FIG. 2 shows an enlarged view of one of the memory cells.

One of the memory cells MC is shown enlarged in FIG. 2. It has a selection transistor TM and a storage capacitor CM. The storage capacitor CM has a ferroelectric dielectric. One of its electrodes is connected to the associated bit line BL via the selection transistor TM. Its other electrode is connected to one of the plate lines PL. The gate of the selection transistor TM is connected to one of the word lines WL.

The bit lines BL are connected via a respective first n-channel transistor T1 to an associated differential sense amplifier SA. FIG. 1 shows a total of four sense amplifiers SA which are each assigned four bit line pairs BL. Each sense amplifier SA is connected to a pair of data lines DLi via two second transistors T2. In the event of a write access, data are transferred via the data lines DLi to the sense amplifiers SA and from the latter via the bit lines BL to the memory cells MC. In the event of a read access, data is transferred in the opposite direction, the sense amplifiers serving for amplifying the differential signal established during the read-out on the respective bit line pair.

In each case four of the bit line pairs BL are combined to form a respective column CLi. FIG. 1 shows a total of four columns CLi. In the event of an access to the memory cell MC, only one of the columns CLi is selected in each case, with the result that, for example in the event of a read access, the sense amplifiers SA serve only for amplifying data supplied by the column CLi.

The word lines are connected to outputs of a row decoder RDEC, to which row addresses RADR can be fed. The row decoder RDEC selects one of the word lines WL in a manner dependent on the row address RADR that is respectively present.

Each of the bit line pairs BL is assigned one of the plate lines PL. The plate lines PL are illustrated by broken lines in FIG. 1. The four plate lines PL of each column CLi are electrically connected to one another. They are connected to outputs of a column decoder CDEC via a respective column select line CSLi. Column addresses CADR can be fed to the column decoder CDEC. The column decoder CDEC selects one of the column select lines CSLi in a manner that is dependent on the column addresses CADR which are fed to it. On this selected column select line CSLi, the column decoder CDEC generates the pulsed signals—required for a read access or write access to the memory cells—for the plate lines PL that are connected to the respective column select line CSLi. The pulsed signals can have, for example, the profile that is shown in U.S. Pat. No. 5,592,410.

The four plate lines PL of each column CLi are connected, at their ends remote from the column decoder CDEC, to the control terminals of the first transistors T1 that are assigned to the respective column CLi. Consequently, the outputs of the column decoder CDEC are connected to the control terminals of the first transistors T1 via the plate lines PL.

FIG. 1 additionally shows an "OR" gate OR having four inputs. Each of these inputs is connected to the four plate lines PL of each column CLi. The output of the OR gate OR is connected to the first input of a first "AND" gate AND1, whose output is connected to an activation unit AKT of each sense amplifier SA. A second input of the first "AND" gate AND1 is connected to an activation line CSA. The activation units AKT serve for activating the respective sense amplifier SA if a high level is fed to them. This is the case if both the activation signal CSA and the output of the "OR" gate OR have a high level.

The output of the "OR" gate OR is additionally connected to a first input of a second "AND" gate AND2, whose output is connected to the control terminals of the second transistors T2 A second input of the second "AND" gate AND2 is connected to a select line DLS. The second transistors T2 are turned on via the second "AND" gate AND2 if both the select signal DLS and the output signal of the "OR" gate OR have a high level.

The plate lines PL have a low level in the non-selected state. In the event of a read access to the memory cells MC of one of the columns CLi, the column decoder CDEC selects the corresponding column select line CSLi in a manner that is dependent on the column address CADR which is present at it. Via this column select line CSLi, the column decoder CDEC transfers the pulsed signals that are required for the read-out to the four plate lines PL of the selected column CLi. By means of these pulsed signals, first the eight first transistors T1 assigned to this column CLi are turned on. At the same time, pulsed signals likewise occur at the output of the "OR" gate OR. The activation line CSA and the select line DLS assume a high level. Therefore, the four sense amplifiers SA are activated, via the first "AND" gate AND1 and their activation units AKT, by the output signal of the "OR" gate OR, for example, by being connected to a supply potential of the integrated circuit. The output signal of the "OR" gate OR is also fed, via the second "AND" gate AND2, to the control terminals of the second transistors T2, with the result that the latter are also turned on in time with the pulsed signals.

In this exemplary embodiment, the column decoder CDEC thus serves both for the selection of the plate lines PL and for the activation of the first transistors T1 of one of the columns CLi, of the four sense amplifiers SA and also of the eight second transistors T2 that are connected to the latter. In other exemplary embodiments of the invention, it is also possible for only one or two of the three elements mentioned to be connected to the column decoder CDEC via the plate lines PL.

The "OR" gate OR is necessary since, in this exemplary embodiment, the sense amplifiers SA serve, with multiplexing, for amplifying data supplied from the four different columns CLi. They must thus be activated whenever only one of the columns CLi is selected by the column decoder CDEC.

FIG. 1 merely shows a detail from a larger memory having a plurality of groups of, in each case, four sense amplifiers SA with the associated first transistors T1 and second transistors T2, and also the connected memory cells MC. All of these groups are connected via their eight second transistors T2 to the same four data line pairs DLi. However, only one column CLi in one of the sense amplifier groups is in each case selected via the column decoder CDEC, with the result to that only from this selected column CLi, in the event of a read access, are four data bits transferred via the associated sense amplifiers SA to the data line pairs CLi. Thus, whereas each column CLi is assigned a different column address CADR, the activation line CSA and the select line DLS are common to all the sense amplifier groups.

We claim:

1. An integrated memory, comprising:
   bit lines;
   word lines;
   crossover points where said bit lines crossover said word lines;
   memory cells that are configured at said crossover points, each one of said memory cells including at least one selection transistor having a control terminal that is connected to one of said word lines, each one of said memory cells including a storage capacitor having a first electrode that is remote from said selection transistor and a second electrode, said selection transistor connecting said second electrode of said storage capacitor to one of said bit lines;
   plate lines for carrying pulsed signals, each one of said plate lines connected to said first electrode of said storage capacitor of a respective one of said memory cells, said plate lines configured parallel to said bit lines;
   a row decoder for addressing said word lines;
   a column decoder for selecting at least one of said plate lines in dependence on a column address;
   sense amplifiers for amplifying data that are read from said memory cells, each one of said sense amplifiers are respectively connected to at least two of said bit lines which are assigned different column addresses;
   control units for performing a function that is selected from the group consisting of supplying input signals to said sense amplifiers, forwarding output signals from said sense amplifiers, and activating said sense amplifiers, said control units including first switching elements and second switching elements; and
   data lines for transferring the data that have been read from said memory cells and that have been amplified by said sense amplifiers, said second switching elements connecting said data lines to said sense amplifiers;
   a respective one of said plate lines and at least one of said bit lines are connected to a given one of said memory cells;
   said sense amplifiers are connected to a respective one of said bit lines by a respective one of said first switching elements;
   each one of said first switching elements including a control terminal that is connected to said column decoder;
   each one of said second switching elements including a control terminal;
   said plate lines defining groups of said plate lines;
   each one of said groups of said plate lines is respectively assigned to said at least two of said bit lines that are connected to a respective one of said sense amplifiers; and
   each one of said groups of said plate lines is connected, using an OR function, to said control terminal of one of said second switching elements, said one of said second switching elements is connected to a respective one of said sense amplifiers.

2. The integrated memory according to claim 1, wherein:
   each one of said groups of said plate lines includes one of said plate lines that is assigned to one of said at least two bit lines;
   said column decoder has outputs; and
   said control terminal of each one of said first switching elements is connected to one of said outputs of said column decoder by said one of said plate lines that is assigned to said one of said at least two bit lines.

3. The integrated memory according to claim 2, wherein:
   each one of said control units includes an activation unit that is assigned to a respective one of said sense amplifiers, said activation unit having an activation input for activating the respective one of said sense amplifiers; and
   said activation input of each one of said control units is connected to a respective one of said outputs of said column decoder by one of said plate lines of a respective one of said groups of said plate lines.

4. The integrated memory according to claim 1, wherein:
   each one of said groups of said plate lines includes one of said plate lines that is assigned to one of said at least two bit lines;
   said column decoder has outputs;
   each one of said control units includes an activation unit that is assigned to a respective one of said sense amplifiers, said activation unit having an activation input for activating the respective one of said sense amplifiers; and said activation input of each one of said control units is connected to a respective one of said outputs of said column decoder by one of said plate lines of a respective one of said groups of said plate lines.

5. The integrated memory according to claim 4, wherein said plate lines are connected, using said OR function, to said activation input of said activation unit of each one of said control units.

6. The integrated memory according to one of claim 1, wherein:

said column decoder has outputs; and said control terminal of each one of said second switching elements is connected to a respective one of said outputs of said column decoder by one of said plate lines of a respective one of said groups of said plate lines.

7. The integrated memory according to claim 1, wherein said storage capacitor of each one of said memory cells includes a ferroelectric dielectric.

* * * * *